United States Patent [19]

Doty, II

[11] Patent Number: 4,739,193
[45] Date of Patent: Apr. 19, 1988

[54] DRIVE CIRCUIT WITH LIMITED SIGNAL TRANSITION RATE FOR RFI REDUCTION

[75] Inventor: James H. Doty, II, Indianapolis, Ind.

[73] Assignee: RCA Corporation, Princeton, N.J.

[21] Appl. No.: 924,867

[22] Filed: Oct. 30, 1986

[51] Int. Cl.⁴ .............................. H03K 17/16
[52] U.S. Cl. .............................. 307/443; 307/451; 307/475; 307/363; 307/263
[58] Field of Search .............. 307/200 B, 443, 448, 307/451, 475, 491, 501, 362, 363, 549, 550, 555, 557–558, 568, 246, 575–577, 579, 584, 585, 263, 270, 279, 290; 330/264, 277

[56] References Cited

U.S. PATENT DOCUMENTS

| | | | |
|---|---|---|---|
| 3,984,703 | 10/1976 | Jorgensen | 307/290 X |
| 4,216,393 | 8/1980 | Gillberg et al. | 307/270 |
| 4,461,963 | 7/1984 | Koomen | 307/290 X |
| 4,464,587 | 8/1984 | Suzuki et al. | 307/290 X |
| 4,507,576 | 3/1985 | McCracken et al. | 307/443 X |
| 4,539,489 | 9/1985 | Vaughn | 307/290 |
| 4,563,594 | 1/1986 | Koyama | 307/443 X |
| 4,567,378 | 1/1986 | Raver | 307/443 X |
| 4,622,482 | 11/1986 | Ganger | 330/264 X |

Primary Examiner—Stanley D. Miller
Assistant Examiner—David R. Hudspeth
Attorney, Agent, or Firm—Paul J. Rasmussen; Peter M. Emanuel; Richard G. Coalter

[57] ABSTRACT

An amplifier applies turn-on bias to the gate electrode of an output field-effect transistor in response to a first level of an input signal applied to the amplifier. A switched power source supplies operating current to the amplifier for developing the turn-on bias when the amplifier input signal is at the first level. A feedback-controlled bypass circuit diverts a portion of the operating current from the amplifier during an initial turn-on period and gradually reduces the magnitude of the diverted operating current as the output transistor turns on thereby producing a "soft" turn-on of the output transistor so as to minimize a potential for creating radio frequency interference in nearby RFI sensitive devices such as the tuner in a television or radio receiver. Complementary circuits include dual current supply and diversion circuits providing controlled rise and fall times for complementary field-effect output transistors.

10 Claims, 3 Drawing Sheets

| Q | W | L |
|---|-----|---|
| 1 | 825 | 5 |
| 2 | 20  | 5 |
| 3 | 30  | 3 |
| 4 | 40  | 5 |
| 5 | 10  | 5 |

| Q | W | L |
|---|---|---|
| 2 | 50 | 3 |
| 3 | 15 | 5 |
| 6 | 825 | 5 |
| 7 | 30 | 5 |
| 8 | 10 | 5 |

DRIVE CIRCUIT WITH LIMITED SIGNAL TRANSITION RATE FOR RFI REDUCTION

FIELD OF THE INVENTION

This invention relates to drive circuits of the type wherein output signal transition times (e.g., rise times and/or fall times) are limited to provide a reduction in radio-frequency interference (RFI).

BACKGROUND OF THE INVENTION

As a general rule, fast output signal transition times are desirable in digital and analog circuits but in certain applications fast signal transitions can create undesired interference with radio or television reception. Consequently, the RFI problem must be given due consideration where drive circuits are to be incorporated in close proximity with sensitive circuits such as the tuners of radio or television receivers. Although many solutions to the RFI problem are known (e.g., shielding, filtering, etc.) few can be conveniently incorporated within digital integrated circuits. One appraoch that does lend itself to implementation in an integrated circuit form is described by Gillberg et al. in U.S. Pat. No. 4,216,393 entitled DRIVE CIRCUIT FOR CONTROLLING CURRENT OUTPUT RISE AND FALL TIMES which issued Aug. 5, 1980. In an example of the Gillberg et al. drive circuit, a common collector connected bipolar output transistor is supplied with a base drive current from an MOS transistor via a current mirror amplifier. The gate circuit of the MOS transistor is connected in parallel with a capacitor to the output of a CMOS inverter which receives drive control signals. Accordingly, the rise-time of output current of the bipolar transistor is determined by the time constant determined by the capacitor value and the channel resistance of the P-type transistor of the CMOS inverter and the fall-time is determined by the capacitor value and the channel resistance of the N-type transistor of the inverter.

SUMMARY OF THE INVENTION

The present invention is directed to meeting the need for a drive circuit having reduced radio frequency radiation, having an output signal voltage swing undegraded by the threshold or saturation characteristics of bipolar transistors and which has minimal requirements for capacitive elements. In exemplary applications described herein, no discrete capacitive elements are required at all thereby providing a drive circuit which may be easily and economically constructed in integrated circuit form.

A drive circuit embodying the invention includes an output field-effect transistor and an amplifier means responsive to a first level of an input signal supplied thereto for applying a turn-on bias to the output transistor. A switched current supply means, responsive to the first level of the input signal, supplies an operating current to the amplifier means for developing the turn-on bias. A power bypass means is coupled to the amplifier means for diverting a portion of the amplifier operating current to a reference potential point during an initial portion of a turn-on interval and is responsive to the turn-on bias during a second portion of the turn-on interval for reducing the magnitude of the current diverted from the amplifier to zero as the power transistor turns on.

BRIEF DESCRIPTION OF THE DRAWING

The foregoing and further features of the invention are illustrated in the accompanying drawing wherein like elements are denoted by like reference designators and in which.

DETAILED DESCRIPTION

Figures 1, 2:
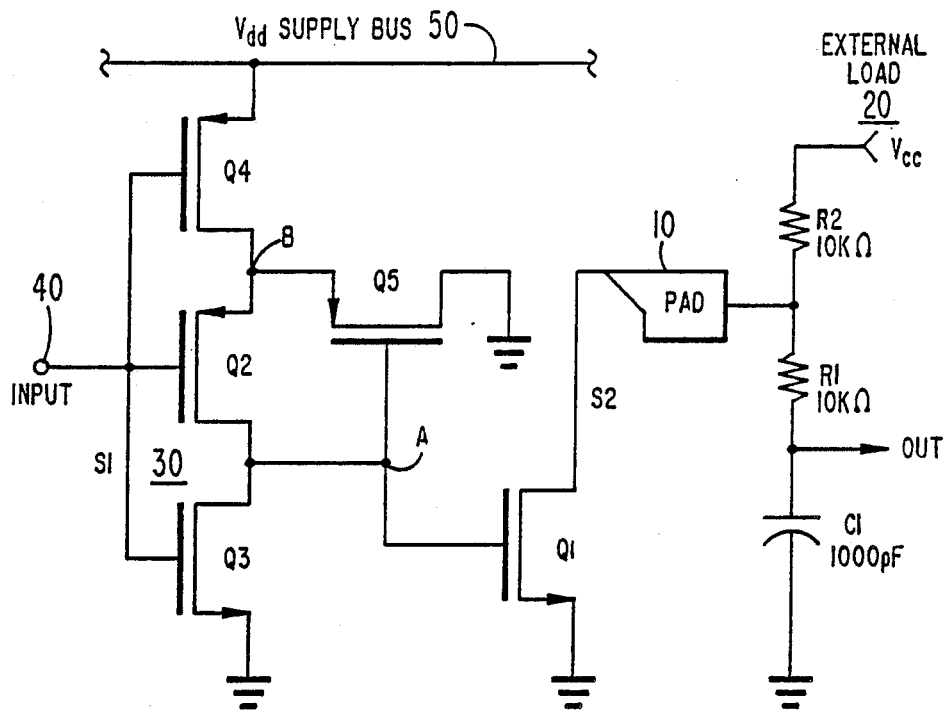
FIG. 1 is a shcematic diagram of a drive circuit embodying the invention for providing a controlled output signal fall time.
FIG. 2 is a table listing of channel length and width dimensions for transistors used in the drive circuit of FIG. 1.

The drive circuit of FIG. 1 includes a common source connected N-channel field-effect output transistor Q1 having a source electrode connected to a ground reference potential point and a drain electrode connected to an output terminal identified as PAD 10. The term "PAD" is short for "bonding pad" which is a connection point in an integrated circuit device for coupling to external circuits. It is a feature of the invention that all elements of the drive circuit (transistors Q1–Q5) may be found in an integrated circuit. This feature resides in part because of a power switching and feedback arrangement, to be described, which minimizes the need for capacitive elements and, in this example of the invention, completely eliminates the need for discrete capacitors within the drive circuit.

For purposes of illustration and explanation, an external load circuit 20 is shown connected to PAD 10. The load circuit comprises resistor R1 and capacitor C1 coupled between PAD 10 and ground to form an R-C integrator. Such a load is used, for example, for converting output pulses produced at PAD 10 to an analog signal proportional to the average of the pulses. A so-called "pull-up" resistor R2 is connected between PAD 10 and a positive supply voltage source Vcc to provide a source of load current for the open drain output transistor Q1. Exemplary values for R1, R2 and C1 are listed on the drawings.

Turn-on gate bias for output transistor Q1 is provided by a complementary field-effect transistor amplifier 30 comprising a P-channel transistor Q2 having a source electrode (signified by an arrowhead) connected to an amplifier power supply input node B, a drain electrode connected to an output node A to which the gate of transistor Q2 is connected and a gate electrode connected to a drive circuit input terminal 40. An N-channel field-effect transistor Q3 in complementary field-effect transistor amplifier 30 has a source electrode connected to ground, a drain electrode connected to node A and a gate electrode connected to input terminal 40.

Operating current for amplifier 30 is supplied to its power input terminal (node B) by means of a switched current supply transistor Q4 which is a P-channel device having a source electrode connected to a Vdd supply bus 50, a drain electrode connected to power input mode B of amplifier 30 and a gate electrode connected to input 40. A portion of this operating current is bypassed to ground, as will be explained, by means of a P-channel feedback controlled power bypass transistor Q5 having a source electrode connected to the power input terminal (node B) of amplifier 30, a drain electrode connected to ground reference potential and a gate electrode connected to node A.

In operation, a HIGH level input signal S1 at input 40 turns transistor Q3 on and turns transistors Q2 and Q4 off. Accordingly, no current is supplied to node A via Q2 and Q4 and node A is clamped to ground via Q3 thereby turning the output transistor Q1 off. When the input signal S1 makes a transition to a LOW level, a number of events occur regarding turn-on of output transistor Q1. Specifically, transistor Q3 is turned off and transistor Q2 and Q4 are turned on. Transistor Q4 supplies operating current to transistor Q2 of amplifier 30 but a portion of this current is initially diverted to ground by bypass transistor Q5. This results because at the moment of turn-on the gate-to-channel capacity of transistor Q1 is in a discharged state. This tends to hold the voltage at node A low which, in turn, biases transistor Q5 on thereby diverting a portion of the turn-on current provided by power switching transistor Q4 to ground. The portion of the current passed by transistor Q2 thus charges node A relatively slowly during a first portion of the turn-on interval of output transistor Q1 thereby slowing the turn-on. As the node A voltage rises, transistor Q5 gradually turns off so as to divert less current from amplifier 30 until its threshold is reached and then it turns off completely. This action reduces the magnitude of the diverted circuit to zero during a second portion of the turn-on interval of output transistor Q1 to thereby bias transistor Q1 completely on.

When transistor Q1 is off capacitor C1 is charged via resistors R1 and R2. Accordingly the rise time of the output signal at PAD 10 is limited by capacitor C1. The fall time of signal S2 is limited by the drive circuits (Q1–Q5) as previously explained. The drive circuit thus functions to effectively isolate PAD 10 and external load 20 from rapid transitions of the input signal S1 which may tend to produce radio frequency interference and so RFI is substantially confined to the integrated circuit in which transistors Q1–Q5 are fabricated.

FIG. 2 provides a table listing of exemplary channel length and width dimensions (in microns) for transistors Q1–Q5. As is apparent from the table the control transistors Q2–Q4 are very small (i.e., an order of magnitude smaller) as compared with the output transistor and so little additional chip area is required to implement the turn-on limiting feature of the invention. Also, in this example of the invention no capacitance is needed other than that afforded by the gate capacitance of the output transistor. This provides a further benefit in area reduction. The gate of bypass transistor Q5 also contributes additional capacitive loading to node A.

In experiments it was found that the turn-on time of output transistors Q1 was desirably increased from less than 5 nanoseconds to about 100 nanoseconds by the addition of the power control and bypass circuits shown. This increase in turn-on time (over 20:1) substantially reduces radiation from PAD 10 and this minimizes interference with tuners in close proximity with the integrated circuit. In an exemplary application the drive circuit is intended to be used in a television receiver for applying the output of a binary rate multiplier (a high speed pulse train) to the integrator (load 20) for producing an analog control voltge for audio control circuits (bass, treble, volume). RFI reduction is of particular importance in such an application to prevent pick-up by the receiver tuner and the production of undesirable visual as well as sound artifacts.

Figures 3, 4:
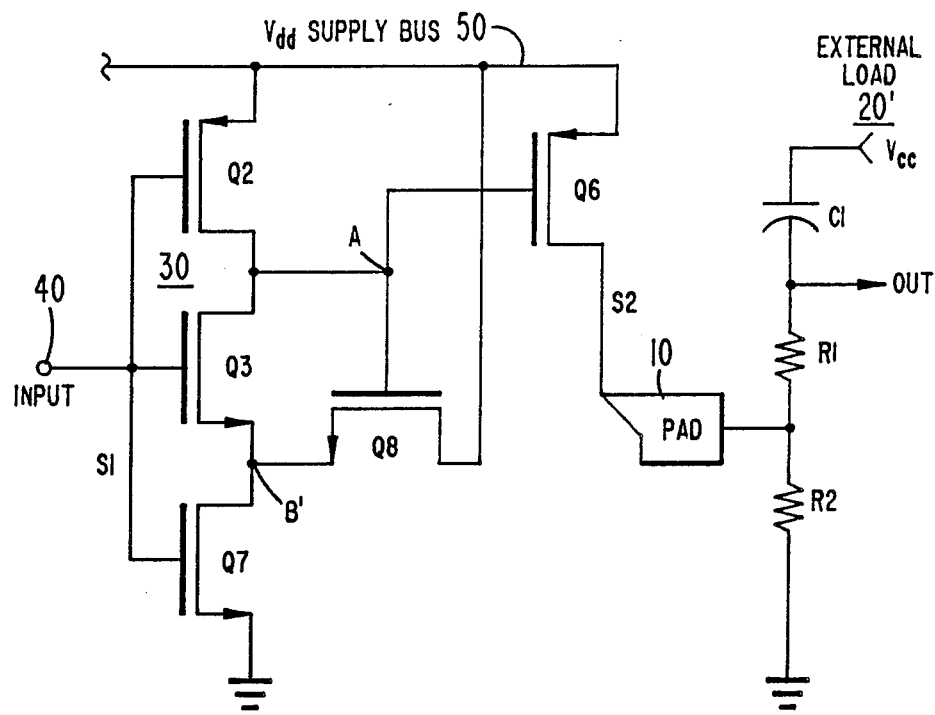
FIG. 3 is a schematic diagram illustrating a modification of the drive circuit of FIG. 1 for providing a controlled output signal rise time.
FIG. 4 is a table listing of channel length and width dimensions for transistors used in the drive circuit of FIG. 3.

The drive circuit of FIG. 1 may be modified as shown in FIG. 3 to provide active pull-up rather than active pull-down of PAD 10. In the modified circuit the output transistor Q1 is replaced by a common source connected P-channel transistor Q6 having a conduction path coupled between Vdd supply bus 50 and output bonding pad 10. Transistor Q6 thus sources current to pad 10 when turned on rather than serving as an output current sink as in the previous example. The connections of the external load circuit are reversed with respect to the ground and Vcc supply points to provide an integrated output voltage which increses in proportion to the on-time of the output transistor Q6. Amplifier 30 is connected to drive node A as in the previous example except that the source of transistor Q2 is connected to Vdd supply bus 50 and the source of transistor Q3 is connected to mode B'. Operating current for amplifier 30 is supplied to node B' from ground by an N-channel common source connected transistor Q7 and diverted from mode B' during turn-on of transistor Q6 by means of N-channel transistor Q8. The power control and bypass transistors Q7 and Q8 serve the same function as transistors Q4 and Q5 of FIG. 1 except for the reversal of the direction of current flow. Otherwise operation is the same as in the previous example. FIG. 4 provides an exemplary listing of the transistor gate dimensions (in microns).

Figure 5:
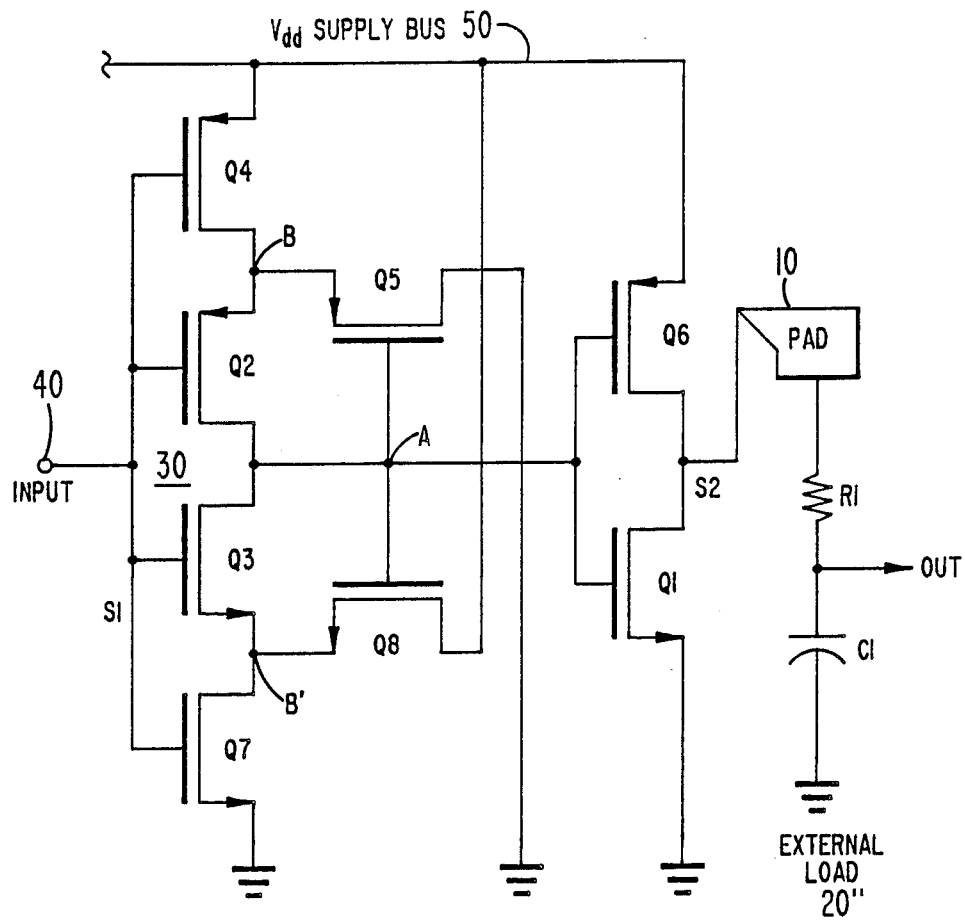
FIG. 5 is a schematic diagram of a drive circuit incorporating features of the drive circuits of FIGS. 1 and 2 for providing controlled output signal rise and fall times.

The active pull-down and active pull-up drive circuits of FIGS. 1 and 3 may be combined as shown n FIG. 5 to provide a drive circuit having controlled rise and fall time and which does not require external pull-up or pull-down load resistors (resistor R2 is deleted from the external load). Here amplifier 30 drives the gate electrodes of both of the output transistors Q1 and Q6. Transistors Q4 and Q5 function as previously described to extend the turn-on time of N-channel output transistor Q1 and transistors Q7 and Q8 similarly delay turn on of P-channel output transistor Q6 as previously described.

What is claimed is:
1. A drive circuit, comprising:
an output field-effect transistor for developing an output signal;
an output terminal coupled to said output field-effect transistor;
amplifier means responsive to a first level of an input signal supplied thereto for applying a turn-on bias to said output transistor;
a first source of reference potential;
switched current supply means coupled to said first source of reference potential and responsive to said first level of said input signal for supplying an operating current to said amplifier means for developing said turn-on bias; and
power bypass means coupled to said amplifier means for diverting a portion of said operating current to a reference potential point during an initial portion of a turn-on interval, said bypass means being responsive to said turn-on bias during a second portion of said turn-on interval for reducing the magnitude of the current diverted from said amplifier means to zero as said output transistor turns on, so that said output signal at said otuput terminal exhibits a reduced rate of change with respect to changes of said input signal for reducing radio frequency interference.

2. A drive circuit as recited in claim 1 wherein said output transistor, said amplifier means, said switched current supply means and said power bypass means are formed in an integrated circuit, said output field-effect transistor having a drain electrode connected to an output bonding pad of said integrated circuit and further comprising an external load circuit coupled to said bonding pad, whereby rapid transitions of said input signal which tend to produce radio frequency interference are effectively isolated from said bonding pad and said external load circuit by said drive circuit so as to substantially confine said interference to said integrated circuit.

3. A drive circuit as recited in claim 1 wherein said switched current supply means and said bypass means comprises:
   a second source of reference potential;
   a first transistor having a source electrode connected to said second source of reference potential, a gate electrode connected to a signal input terminal of said amplifier means and a drain electrode connected to a power input terminal of said amplifier means; and
   a second transistor having a source electrode connected to said drain electrode of said first transistor, a drain electrode connected to said first source of reference potential and having a gate electrode connected to an output terminal of said amplifier means.

4. A drive circuit, comprising:
   a first P-channel transistor having a source electrode connected to a first potential supply source, a drain electrode connected to a first circuit node, and a gate electrode connected to an input terminal;
   a second P-channel transistor having a source electrode connected to said first circuit node, a drain electrode connected to a second circuit node and a gate electrode connected to said input terminal;
   a third N-channel transistor having a drain electrode connected to said second circuit node, a source electrode connected to a second potential supply source and a gate electrode connected to said input terminal;
   a fourth P-channel transistor having a gate electrode connected to said second circuit node, a source electrode connected to said first circuit node and a drain electrode connected to said second potential supply source; and
   a fifth N-channel transistor having a gate electrode connected to said second circuit node, a source electrode connected to said second potential suuply source and having a drain electrode connected to an output terminal;
   said second circuit node haivng a connection to a single low impedance point, said low impedance point beng said junction of said second P-channel transistor and said third N-channel transistor.

5. A drive circuit as recited in claim 4 wherein said first, second, third, fourth and fifth transistors are formed in an integrated circuit having an output bonding pad connected to said output terminal and further comprising an external load circuit coupled to said bonding pad, whereby rapid transistions of a control signal applied to said input terminal tending to produce radio frequency interference are isolated from said bonding pad and said external load circuit by said drive circuit thereby substantially confining said interference to said integrated circuit.

6. A drive circuit, comprising:
   a first P-channel transistor having a source electrode connected to a first potential suuply source, a drain electrode connected to a first circuit node, and a gate electrode connected to an input terminal;
   a second N-channel transistor having a drain electrode connected to said first circuit node, a source electrode connected to a second circuit node and a gate electrode connected to said input terminal;
   a third N-channel transistor having a drain electrode connected to said second circuit node, a source electrode connected to a second potential suuply source and a gate electrode connected to said input terminal;
   a fourth N-channel transistor having a drain electrode connected to said second circuit node, a gate electrode connected to said first circuit node and a drain electrode connected to said first potential supply source; and
   a fifth P-channel transistor having a source electrode connected to said first potential supply source, a gate electrode connected to said first circuit node and a drain electrode connected to an output terminal;
   said first circuit node having a connection to a single low impedance point, said low impedance point being said junction of said first P-channel transistor and said second N-channel transistor.

7. A drive circuit as recited in claim 6 wherein said first, second, third, fourth and fifth transistors are formed in an integrated circuit having an output bonding pad connected to said output terminal and further comprising an external load circuit coupled to said bonding pad, whereby rapid transistions of a control signal applied to said input terminal tending to produce radio frequency interference are effectively isolated from said bonding pad and said external load circuit by said drive circuit and thereby substantially confining said interference to said integrated circuit.

8. A drive circuit comprising, in combination:
   a first P-channel transistor having a conduction path connected between a first potential supply source and a first circuit node;
   a second P-channel transistor having a conduction path connected between said first circuit node and a second circuit node;
   a third N-channel transistor having a conduction path connected between said second circuit node and a third circuit node;
   a fourth N-channel transistor having a conduction path connected between said third circuit node and a second potential supply source; and
   a fifth P-channel transistor having a conduction path connected between said first circuit node and said second potential supply source and having a gate electrode connected to said second circuit node;
   a sixth N-channel transistor having a conduction path connected between said third circuit node and said first potential supply source and having a gate electrode connected to said second current node; and first circuit means for applying an input signal to the gate electrodes of said first, second, third and fourth transistors; and second circuit means coupled to an output terminal for deriving an output signal from said second circuit node, sid output signal at said output terminal exhibiting a reduced rate of change with respect to changes in said input signal for reducing radio frequency interference.

9. A drive circuit as recited in claim 8 wherein said circuit means comprises:

a seventh N-channel transistor having a gate electrode connected to said second circuit node a source electrode connect to said second potential supply source and a drain electrode connected to an output terminal; an an eighth P-channel transistor having a gate electrode connected to said second circuit node, a drain electrode connected to said output terminal and a source electrode connected to said first potential supply source.

10. A drive circuit as recited in claim 9 wherein said transistors are formed in an integrated circuit having an output bonding pad connected to said output terminal and further comprising an external load coupled to said bonding pad whereby rapid transitions of said input signal which tend to produce radio frequency interference are effectively isolated from said bonding pad and said external load by said drive circuit thereby substantially confining said interference to said integrated circuit.

* * * * *